United States Patent
Kim et al.

(10) Patent No.: US 8,021,980 B2
(45) Date of Patent: Sep. 20, 2011

(54) METHODS OF MANUFACTURING SEMICONDUCTOR DEVICES INCLUDING A COPPER-BASED CONDUCTIVE LAYER

(75) Inventors: Youngseok Kim, Gyeonggi-do (KR);
Jong-ho Yun, Gyeonggi-do (KR);
Kwang-jin Moon, Gyeonggi-do (KR);
Gil-heyun Choi, Gyeonggi-do (KR);
Jong-myeong Lee, Gyeonggi-do (KR);
Zung-sun Choi, Gyeonggi-do (KR);
Hye-Kyung Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/753,196

(22) Filed: Apr. 2, 2010

(65) Prior Publication Data
US 2010/0255676 A1 Oct. 7, 2010

(30) Foreign Application Priority Data
Apr. 2, 2009 (KR) .................. 10-2009-0028537

(51) Int. Cl.
*H01L 21/44* (2006.01)

(52) U.S. Cl. ........ 438/652; 438/674; 438/677; 438/678; 438/687

(58) Field of Classification Search .................. None
See application file for complete search history.

(56) References Cited

U.S. PATENT DOCUMENTS

| 2004/0242446 | A1* | 12/2004 | Mun et al. ................. 510/175 |
| 2005/0101130 | A1* | 5/2005 | Lopatin et al. .............. 438/678 |
| 2007/0287277 | A1 | 12/2007 | Kolics et al. |
| 2007/0292615 | A1* | 12/2007 | Dordi et al. ................ 427/299 |
| 2009/0155468 | A1* | 6/2009 | Petrov et al. ............... 427/306 |
| 2009/0162537 | A1* | 6/2009 | Kolics et al. .............. 427/98.6 |

FOREIGN PATENT DOCUMENTS

| JP | 2006-229031 | 8/2006 |
| KR | 1020080039412 A | 5/2008 |

* cited by examiner

*Primary Examiner* — Scott B Geyer
(74) *Attorney, Agent, or Firm* — Myers Bigel Sibley & Sajovec (57) ABSTRACT

Provided are methods of manufacturing semiconductor devices. The methods may include forming a first insulation layer on a semiconductor substrate, forming a groove by selectively etching the first insulation layer, filling the groove with a copper-based conductive layer, depositing a cobalt-based capping layer on the copper-based conductive layer by electroless plating, and cleansing the first insulation layer and the cobalt-based capping layer using a basic cleansing solution.

15 Claims, 5 Drawing Sheets

METHODS OF MANUFACTURING SEMICONDUCTOR DEVICES INCLUDING A COPPER-BASED CONDUCTIVE LAYER

CROSS-REFERENCE TO RELATED APPLICATIONS

This application claims the benefit of Korean Patent Application No. 10-2009-0028537, filed on Apr. 2, 2009, in the Korean Intellectual Property Office, the disclosure of which is incorporated herein in its entirety by reference as if set forth fully herein.

BACKGROUND

The present invention relates to semiconductor devices, and more particularly, to methods of manufacturing semiconductor devices.

With the rapid development of the electronics industry, semiconductor devices having high speed and high integration degree have been manufactured. In order to achieve both high speed and high integration degree, copper wiring techniques have been used. However, when conventional copper wiring techniques are applied, the electromigration (EM) characteristics may be decreased due to reduction in a wiring line width. In this regard, desired electrical characteristics of the semiconductor device may not be achieved.

SUMMARY

Some embodiments of the present invention provide methods of manufacturing semiconductor devices including a copper wiring and having improved electric characteristics.

According to some embodiments of the present invention, there are provided methods of manufacturing a semiconductor device. Methods may include forming a first insulation layer on a semiconductor substrate; forming a groove by selectively etching the first insulation layer, filling the groove with a copper-based conductive layer, depositing a cobalt-based capping layer on the copper-based conductive layer by electroless plating, and cleansing the first insulation layer and the cobalt-based capping layer using a basic cleansing solution.

Some embodiments provide that filling the groove with a copper-based conductive layer may include forming a preliminary copper-based conductive layer on the first insulation layer so as to fill the groove and removing a portion of the preliminary copper-based conductive layer such that the first insulation layer is exposed.

In some embodiments, filling the groove with a copper-based conductive layer so as to fill the groove may include removing a portion of the preliminary copper-based conductive layer by a chemical mechanical polishing (CMP) method and preliminarily cleansing the exposed first insulation layer and the exposed copper-based conductive layer using another basic cleansing solution.

In the preliminarily cleansing, an upper surface of the first insulation layer may be disposed at a higher level than an upper surface of the copper-based conductive layer with respect to the semiconductor substrate.

The basic cleansing solution may be pH 10 to pH 14. Some embodiments provide that the basic cleansing solution may include ethanolamine or ascorbic acid.

The methods may further include, after the cleansing using a basic cleansing solution, cleansing the first insulation layer and the cobalt-based capping layer using an acidic cleansing solution.

In some embodiments, the acidic cleansing solution may be pH 0 to pH 2. The acidic cleansing solution may include oxalic acid, sulfuric acid, carboxylic acid, glyoxylic acid, or hypophosphorous acid.

The methods may further include, after the cleansing using an acidic cleansing solution, forming a second insulation layer on the exposed first insulation layer and the exposed cobalt-based capping layer.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION OF THE EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

FIGS. 1 through 9 are cross-sectional views for explaining methods of manufacturing semiconductor devices according to some embodiments of the present invention. In some embodiments, methods include forming a copper wiring using a dual damascene method.

Figure 1:
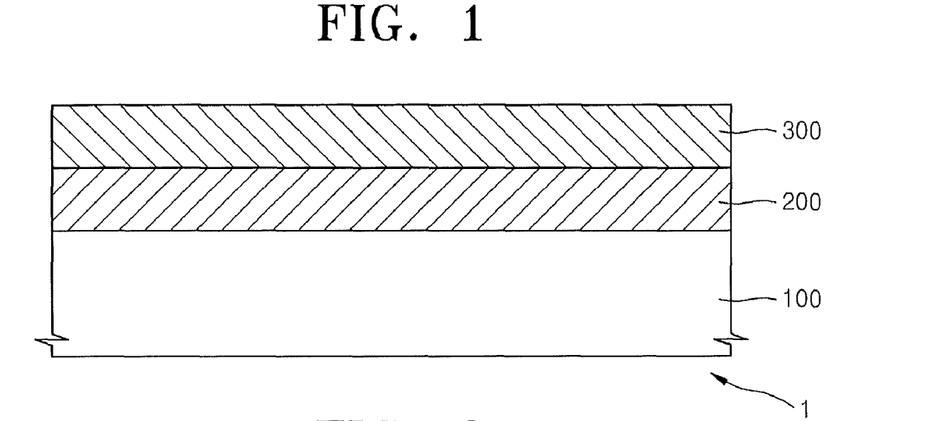
FIG. 1 is a cross-sectional view for explaining a process of forming a preliminary lower insulating layer and a preliminary upper insulation layer on a semiconductor substrate of a semiconductor device, according to some embodiments of the present invention.

FIG. 1 is a cross-sectional view for explaining a process of forming a preliminary lower insulating layer 200 and a preliminary upper insulation layer 300 on a semiconductor substrate 100 of a semiconductor device 1, according to some embodiments of the present invention.

Referring to FIG. 1, a preliminary lower insulation layer 200 and a preliminary upper insulation layer 300 may be formed on the semiconductor substrate 100 to manufacture the semiconductor device 1. Some embodiments provide that the semiconductor substrate 100 may be, for example, a silicon substrate, a silicon-on-insulator (SOI) substrate, a gallium-arsenic substrate, a silicon germanium substrate, a ceramic substrate, a quartz substrate, and/or a glass substrate for displays, among others. For example, unit devices (not shown), such as various types of active devices or passive devices needed for manufacturing a semiconductor device, may be formed on the semiconductor substrate 100. Also, device isolation layers (not shown) may be formed on the semiconductor substrate 100. For example, the device isolation layers may be formed by using a local oxidation of silicon (LOCOS) method and/or a shallow trench isolation (STI) method, among others. An interlayer insulation layer (not shown) covering the unit devices may be formed on the semiconductor substrate 100. In some embodiments, conductive areas (not shown), which may be electrically connected to the unit devices via the interlayer insulation layer may be formed on the semiconductor substrate 100. Also, conductive lines (not shown) connecting the unit devices and/or the conductive areas may be formed on the semiconductor substrate 100.

The preliminary lower insulation layer 200 and/or the preliminary upper insulation layer 300 may be formed of an oxide and/or an insulation material including an oxide. Some embodiments provide that a first etching stopping layer (not shown) contacting the preliminary upper insulation layer 300 may be formed on the preliminary lower insulation layer 200. In some embodiments, a second etching stopping layer (not shown) may be formed on the preliminary upper insulation layer 300.

Figure 2:
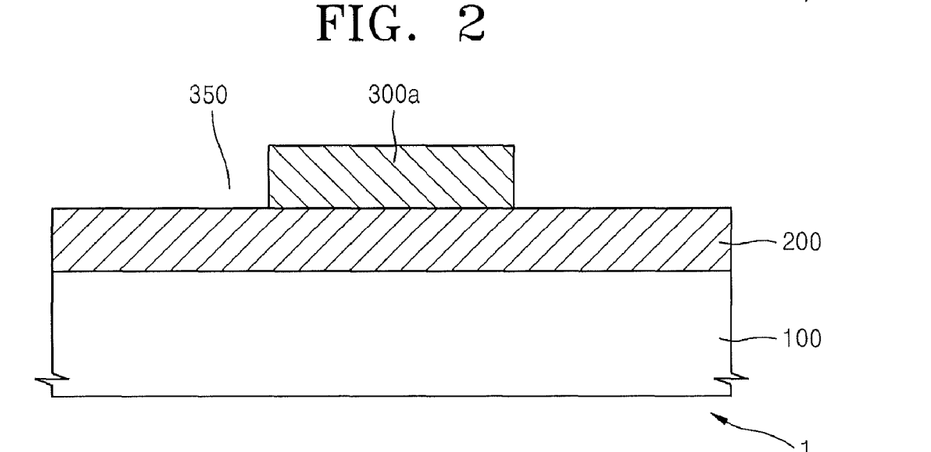
FIG. 2 is a cross-sectional view for explaining a process of forming a trench, according to some embodiments of the present invention.

FIG. 2 is a cross-sectional view for explaining a process of forming a trench 350, according to some embodiments of the present invention.

Referring to FIGS. 1 and 2, the trench 350 may be formed by removing a portion of the preliminary upper insulation layer 300 such that the preliminary lower insulation layer 200 is exposed. An upper insulation layer 300a may electrically insulate spaces between conductive materials that are to be formed in the trench 350. That is, the upper insulation layer 300a may be formed by removing a portion of the preliminary upper insulation layer 300 corresponding to the trench 350.

In order to form the trench 350, a photoresist pattern (not shown) may be formed on the preliminary upper insulation layer 300 by using a photolithography process and then an etching process may be performed. Also, the etching process may be performed until the preliminary lower insulation layer 200 is exposed, by using the etching stopping layer (not shown).

Figure 3:
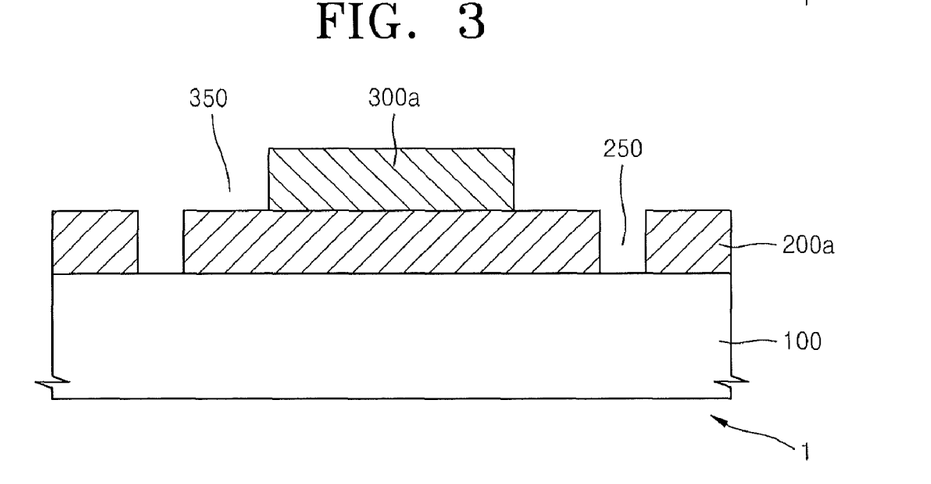
FIG. 3 is a cross-sectional view for explaining a process of forming a via hole, according to some embodiments of the present invention.

FIG. 3 is a cross-sectional view for explaining a process of forming a via hole 250, according to some embodiments of the present invention.

Referring to FIGS. 2 and 3, the via hole 250 may be formed by removing a portion of the preliminary lower insulation layer 200 in order to expose the semiconductor substrate 100. Some embodiments provide that the via hole 250 may be formed to be connected to the trench 350. In some embodiments, the conductive lines formed on the semiconductor substrate 100 may be exposed by the via hole 250. A lower insulation layer 200a may electrically insulate spaces between conductive materials that are to be formed in the via hole 250. That is, the lower insulation layer 200a may be formed by removing a portion of the preliminary lower insulation layer 200 corresponding to the via hole 250.

In order to form the via hole 250, a photoresist pattern (not shown) may be formed on the upper insulation layer 300a and the preliminary lower insulation layer 200 by using a photolithography process and then performing an etching process.

Referring to FIGS. 2 and 3, first the trench 350 and then the via hole 250 may be formed. In some embodiments, a preliminary via hole (not shown) may be formed by removing a portion of the preliminary upper insulation layer 300 and the preliminary lower insulation layer 200. A trench 350 may then be formed by removing a portion of the preliminary via hole and a portion of the preliminary upper insulation layer 300 additionally.

Some embodiments provide that the trench 350 and the via hole 250 altogether may be referred to as a groove.

Figure 4:
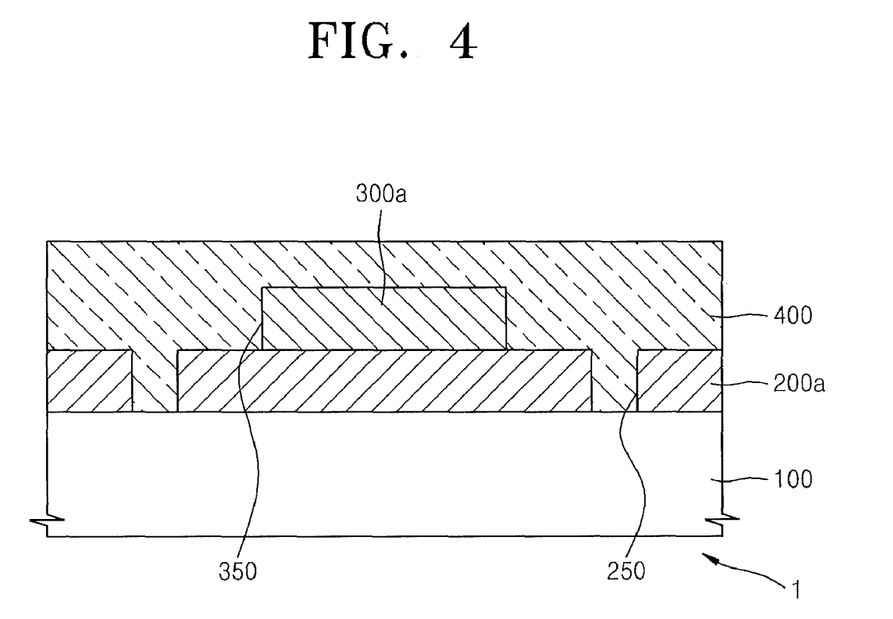
FIG. 4 is a cross-sectional view for explaining a process of forming a preliminary copper-based conductive layer, according to some embodiments of the present invention.

FIG. 4 is a cross-sectional view for explaining a process of forming a preliminary copper-based conductive layer 400, according to some embodiments of the present invention.

Referring to FIG. 4, the preliminary copper-based conductive layer 400 may be formed on the semiconductor substrate 100, on which the lower insulation layer 200a and the upper insulation layer 300a are formed, so as to fill both the via hole 250 and the trench 350. In some embodiments, the preliminary copper-based conductive layer 400 may be formed of copper and/or a copper alloy. The preliminary copper-based conductive layer 400 may be formed by forming a seed layer (not shown) using a physical deposition method and then by electroplating. Some embodiments provide that the seed layer may include copper and/or a copper alloy.

Figure 5:
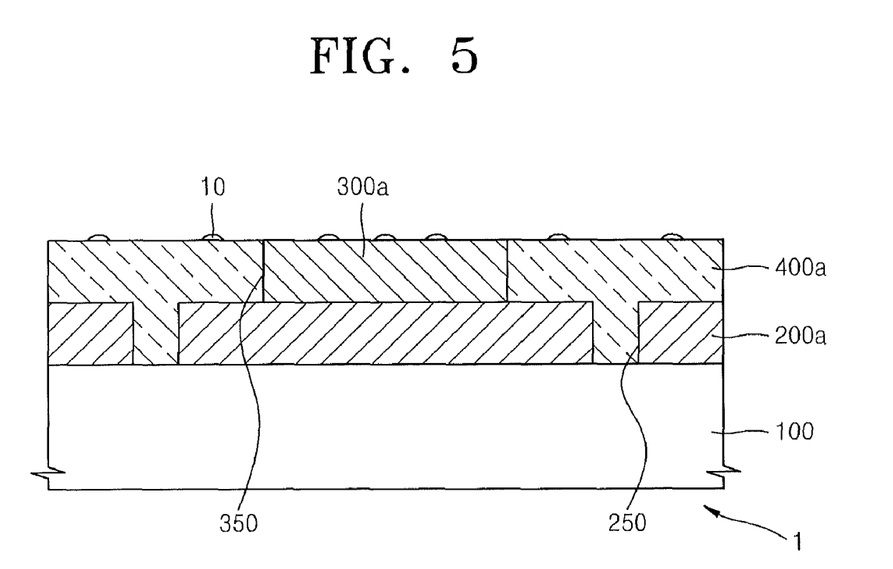
FIG. 5 is a cross-sectional view for explaining a process forming a copper-based conductive layer by partially removing the preliminary copper-based conductive layer, according to some embodiments of the present invention.

FIG. 5 is a cross-sectional view for explaining a process forming a copper-based conductive layer 400 by partially removing the preliminary copper-based conductive layer 450, according to some embodiments of the present invention.

Referring to FIGS. 4 and 5, a portion of the preliminary copper-based conductive layer 400 may be removed so that the upper insulation layer 300a is exposed, thereby forming the copper-based conductive layer 400a. In order to form the copper-based conductive layer 400a, a portion of the preliminary copper-based conductive layer 400 may be removed by using a planarization method such as, for example, a chemical mechanical polishing (CMP) method. In this case, the CMP method may be performed by using the second etching stopping layer until the upper insulation layer 300a is exposed. The copper-based conductive layer 400a formed in this manner may be used as a conductive wiring, which may be referred to as copper wiring, in the semiconductor device 1.

Some embodiments provide that a first residual product 10 may remain on upper surfaces of the upper insulation layer 300a and the copper-based conductive layer 400a. The first residual product 10 may be slurry used in the CMP method and/or a residue of the portion of the preliminary copper-based conductive layer 400 that is removed by the CMP method and may remain on the upper surface of the upper insulation layer 300a and/or the copper-based conductive layer 400a.

As described above, the dual damascene method in which the copper conductive layer 400a is used as a conductive wiring has been described with reference to FIGS. 1 through 5. However, the inventive concept is not limited to the dual damascene methods. The methods of manufacturing semiconductor devices according to the present invention may be applied whenever a planarization method is used for forming the copper conductive layer 400a. That is, the inventive concept may be applied when forming only one of the upper insulation layer 300a and the lower insulation layer 200a and then forming the copper conductive layer 400a using a planarization method such as a CMP method. Accordingly, the upper insulation layer 300a and the lower insulation layer 200a may be referred to as a single first insulation layer and/or as respective first insulating layers. Some embodiments provide that a post CMP cleaning solution may be used to perform the post CMP cleaning operation. The post CMP cleaning solution may comprise a carboxylic acid, such as oxalic acid, citric acid and/or malic acid, among others.

Figure 6:
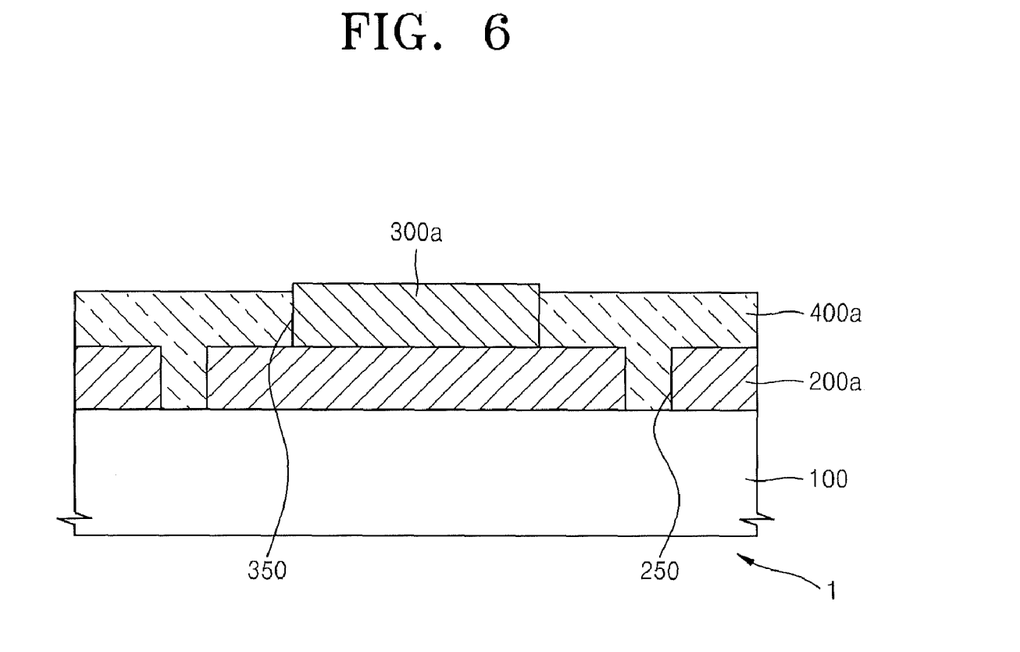
FIG. 6 is a cross-sectional view for explaining a process operating a preliminary cleansing according to some embodiments of the present invention.

FIG. 6 is a cross-sectional view for explaining a process operating a preliminary cleansing according to some embodiments of the present invention.

Referring to FIGS. 5 and 6, a preliminary cleansing operation may be performed to remove the first residual product 10 remaining on the upper surfaces of the upper insulation layer 300a and the copper-based conductive layer 400a. Some embodiments provide that a preliminary cleansing solution may be used to perform the preliminary cleansing operation. The preliminary cleansing solution may be a basic cleansing solution, and in this case, the preliminary cleansing solution may be referred to as another basic cleansing solution. The another basic cleansing solution may be, for example, pH 10 to pH 14.

In some embodiments, the another basic cleansing solution may include ethanolamine and/or ascorbic acid. Some embodiments provide that the another basic cleansing solution may include tetramethylammonium hydroxide (TMAH). For example, in some embodiments, the another basic cleansing solution may include ethanolamine in a proportion of 5% to 15%, and ascorbic acid in a proportion of 1% to 5%. Some embodiments provide that the another basic cleansing solution may include TMAH in a proportion of 3% to 10%. The contents of ethanolamine, ascorbic acid, and/or TMAH may be determined such that the another basic cleansing solution is pH 10 to pH 14.

The first residual product 10 may be removed by using the preliminary cleansing solution. In this case, a portion of an upper portion of the upper insulation layer 300a and/or the copper-based conductive layer 400a may also be removed. In some embodiments, the upper portion of the copper-based conductive layer 400a may be removed more than the upper portion of the upper insulation layer 300a, In this regard, a height of the upper surface of the upper insulation layer 300a may be higher than the upper surface of the copper-based conductive layer 400a with respect to the semiconductor substrate 100. Accordingly, steps may be formed between the upper surface of the upper insulation layer 300a and the upper surface of the copper-based conductive layer 400a.

Figure 7:
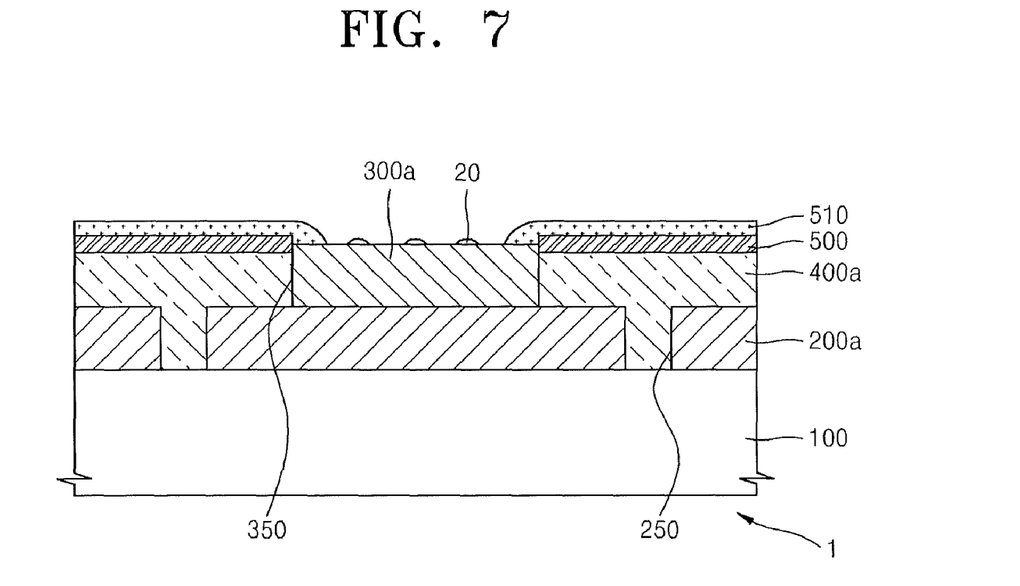
FIG. 7 is a cross-sectional view for explaining a process depositing a cobalt-based capping layer according to some embodiments of the present invention.

FIG. 7 is a cross-sectional view for explaining a process depositing a cobalt-based capping layer 500, according to some embodiments of the present invention.

Referring to FIG. 7, the cobalt-based capping layer 500 may be formed on the copper-based conductive layer 400a. The cobalt-based capping layer 500 may be formed of cobalt and/or a cobalt-alloy. For example, the cobalt-based capping layer 500 may be formed of cobalt-tungsten-phosphor (CoWP) alloy. The cobalt-based capping layer 500 may be formed only on the copper-based conductive layer 400a. The cobalt-based capping layer 500 may be formed using, for example, an electroless plating method, among others. Accordingly, the cobalt-based capping layer 500 may not be formed on the upper surface of the upper insulation layer 300a.

As described above, when the upper surface of the copper-based conductive layer 400a is lower than the upper surface of the upper insulation layer 300a, the cobalt-based capping layer 500 may contact a portion of a side of the upper insulation layer 300a connected to the upper surface of the copper-based conductive layer 400a. Accordingly, some embodiments provide that the copper-based conductive layer 400a may be completely covered by the cobalt-based capping layer 500 so as not to be exposed. As such, the electromigration (EM) characteristics of the copper-based conductive layer 400a may be improved by using the cobalt-based capping layer 500.

When the cobalt-based capping layer 500 is formed, a cobalt residual product layer 510 may be formed and/or a second residual product 20 may remain on upper surfaces of the cobalt-based capping layer 500 and the upper insulation layer 300a. The cobalt residual product layer 510 may be, for example, cobalt oxide ($Co(OH)_2$) that may be formed as a result of oxidization of cobalt. Some embodiments provide that the cobalt residual product layer 510 may be formed on the cobalt-based capping layer 500 and/or on a portion of the upper insulation layer 300a contacting the cobalt-based capping layer 500. The second residual product 20 may be organic containments that are formed from pollutant materials existing on the upper insulation layer 300a when the electroless plating method is performed. The second residual product 20 may be, for example, benzotriazole (BTA) and copper and/or a complex residue of copper and/or cobalt.

Figure 8:
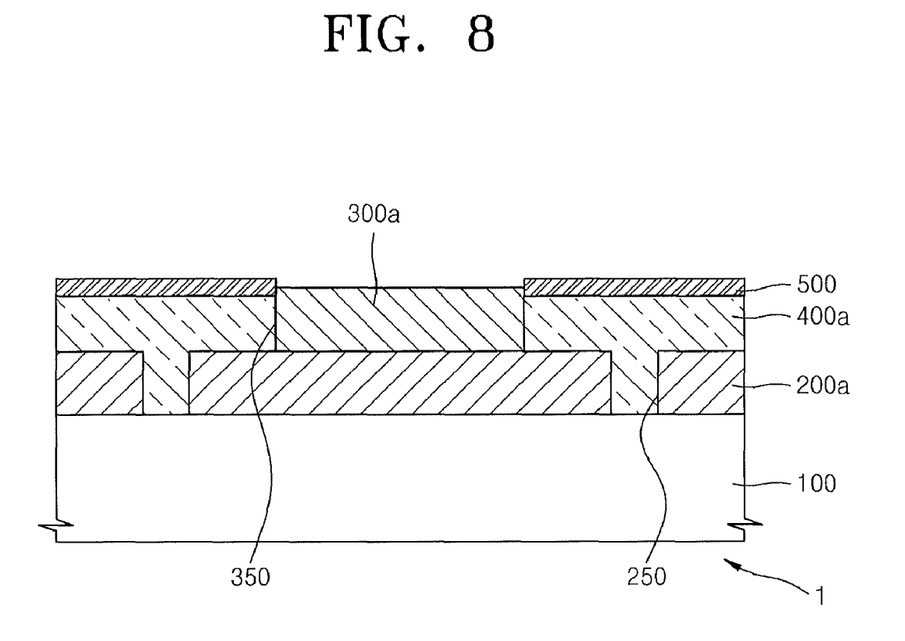
FIG. 8 is a cross-sectional view for explaining a process operating a first cleansing operation or a second cleansing according to some embodiments of the present invention.

FIG. 8 is a cross-sectional view for explaining a process operating a first cleansing operation or a second cleansing according to some embodiments of the present invention.

Referring to FIGS. 7 and 8, a first cleansing operation may be performed to remove the second residual product 20 and/or the cobalt residual product layer 510 remaining on the upper surfaces of the upper insulation layer 300a and/or the cobalt-based capping layer 500. A basic cleansing solution may be used to perform the first cleansing operation. The basic cleansing solution may be, for example, pH 10 to pH 14.

Some embodiments provide that the basic cleansing solution may contain ethanolamine and/or ascorbic acid. In some embodiments, the basic cleansing solution may include tetramethylammonium hydroxide (TMAH). For example, the basic cleansing solution may include ethanolamine in a proportion of 5% to 15%, and/or ascorbic acid in a proportion of 1% to 5%. Some embodiments provide that the basic cleansing solution may include TMAH in a proportion of 3% to 10%. The content of ethanolamine, ascorbic acid, or TMAH may be determined such that the basic cleansing solution is pH 10 to pH 14.

In some embodiments, the basic cleansing solution and the another basic cleansing solution may be a basic cleansing solution of the same type having substantially identical components in substantially identical contents. Some embodiments provide that the basic cleansing solution and the another basic cleansing solution may be of different types having different components in different contents.

Some embodiments provide that when the second residual product 20 and the cobalt residual product layer 510 are removed using the first cleansing solution, only the cobalt-based capping layer 500 and/or the upper insulation layer 300a may be exposed. That is, lateral and upper surfaces of the copper-based conductive layer 400a may be completely covered by the upper insulation layer 300a and the cobalt-based capping layer 500.

In some embodiments, after the first cleansing operation, a second cleansing operation may be performed by using an acidic cleansing solution. The acidic cleansing solution may be pH 0 to pH 2, among others. The acidic cleansing solution may contain acid such as oxalic acid, sulfuric acid, carboxylic acid, glyoxylic acid, and/or hypophosphorous acid in a proportion of 0.1% to 5%, respectively, among others. Also, metal residues that may remain on the upper insulation layer 300a and the cobalt-based capping layer 500 may be removed using the second cleansing operation.

Figure 9:
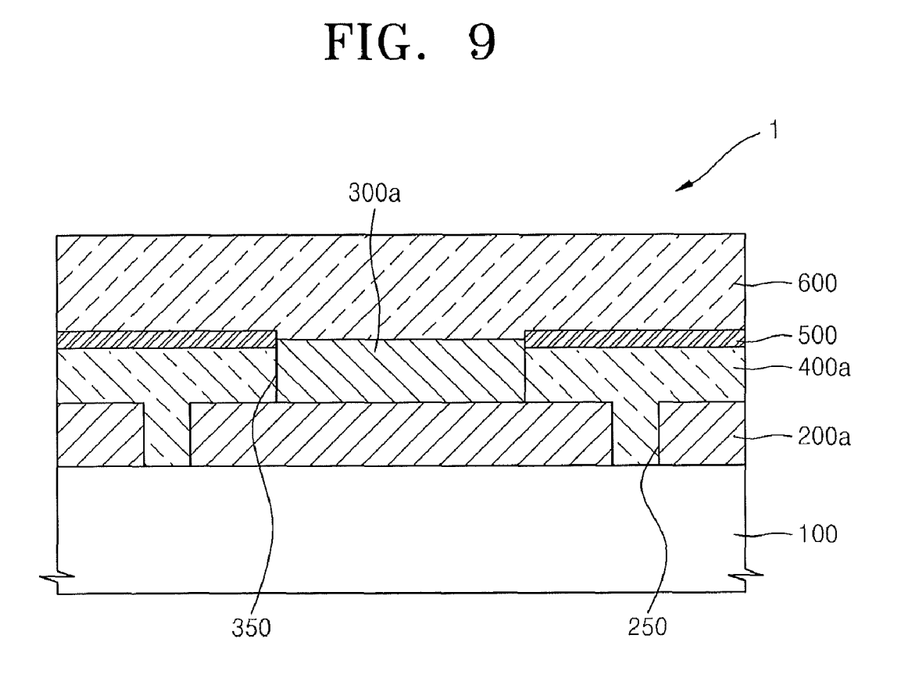
FIG. 9 is a cross-sectional view for explaining a process forming a second insulation layer according to some embodiments of the present invention.

FIG. 9 is a cross-sectional view for explaining a process of forming a second insulation layer 600, according to some embodiments of the present invention.

Referring to FIG. 9, the second insulation layer 600 is formed on the semiconductor substrate 100 on which the cobalt-based capping layer 500 is formed. In some embodiments, the second insulation layer 600 may function as a protection layer that completely covers an upper surface of the cobalt-based capping layer 500. The second insulation layer 600 may be, for example, a silicon nitride layer. Then, after removing a portion of the second insulation layer 600, a conductive plug (not shown) may be formed in the second insulation layer 600 to electrically connect with the copper-based conductive layer 400a.

Figure 10:
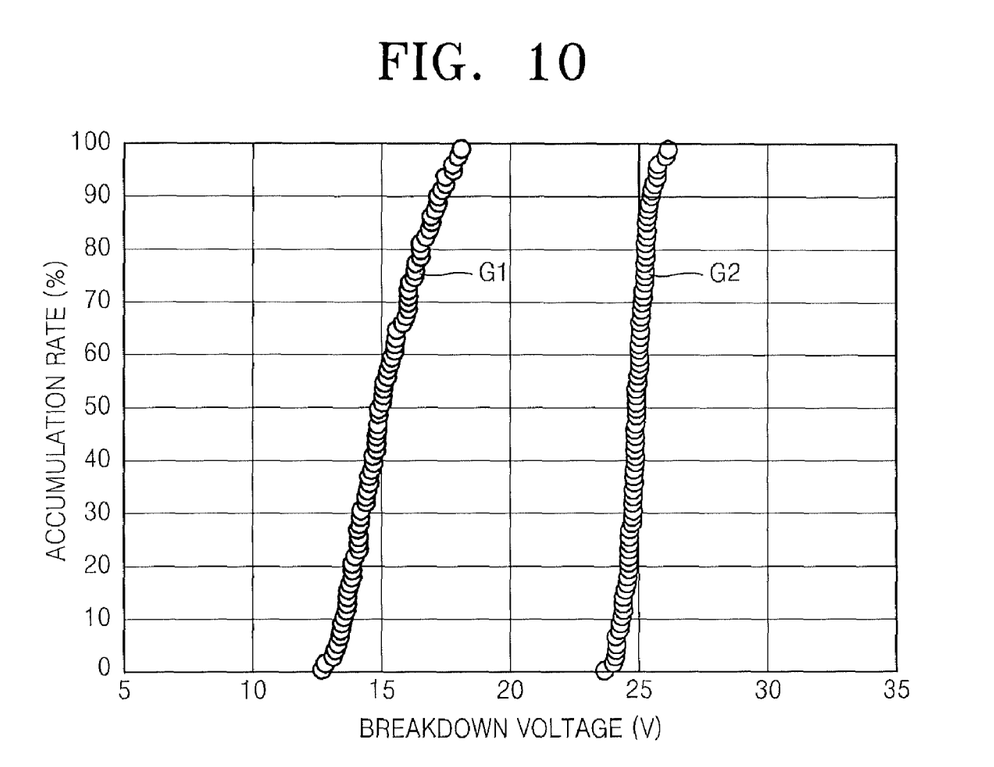
FIG. 10 is a graph showing breakdown voltages of semiconductor devices manufactured according to some embodiments of methods according to the present invention and a conventional method.

FIG. 10 is a graph showing breakdown voltages of semiconductor devices manufactured according to some embodiments of methods of the present invention and a conventional method.

Referring to FIG. 10, a breakdown voltage G2 when methods of the present invention are applied is higher than a breakdown voltage G1 when the methods of the present invention are not applied. In detail, when the methods of the present invention are applied, a high breakdown voltage is higher by about 10 V than a breakdown voltage when the methods of the present invention are not applied. That is, when the method according to the methods of the present invention are used, a leakage current is significantly reduced compared to case where the conventional method is used.

Accordingly, according to the present invention, a leakage current of a semiconductor device may be reduced and/or the time dependent dielectric breakdown (TDDB) characteristics thereof may be improved. Thus, the electrical characteristics of semiconductor device may be increased, thereby obtaining high reliability and high performance semiconductor devices.

The foregoing is illustrative of the present invention and is not to be construed as limiting thereof Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A method of manufacturing a semiconductor device, the method comprising:
   preparing a substrate on which a first insulation layer and a copper-based conductive layer are formed, wherein the first insulation layer and the copper-based conductive layer are exposed;
   depositing a cobalt-based capping layer on the copper-based conductive layer by electroless plating; and
   cleansing the first insulation layer and the cobalt-based capping layer using a basic cleansing solution,
   wherein preparing the substrate on which the first insulation layer and the copper-based conductive layer are formed comprises:
   forming the first insulation layer on the semiconductor substrate;
   forming a groove by selectively etching the first insulation layer; and
   filling the groove with a copper-based conductive layer.

2. The method of claim 1, wherein filling the groove with the copper-based conductive layer comprises:
   forming a preliminary copper-based conductive layer on the first insulation layer so as to fill the groove; and
   removing a portion of the preliminary copper-based conductive layer such that the first insulation layer is exposed.

3. The method of claim 2, wherein removing the portion of the preliminary copper-based conductive layer comprises:
   removing a portion of the preliminary copper-based conductive layer by a chemical mechanical polishing (CMP) method.

4. The method of claim 1, further comprising, before depositing the cobalt-based capping layer, preliminarily cleansing the exposed first insulation layer and the exposed copper-based conductive layer using another basic cleansing solution that is the same as and/or different from the basic cleansing solution.

5. The method of claim 4, wherein in the preliminarily cleansing, an upper surface of the first insulation layer is disposed at a higher level than an upper surface of the copper-based conductive layer with respect to the semiconductor substrate.

6. The method of claim 1, wherein the basic cleansing solution is pH 10 to pH 14.

7. The method of claim 1, wherein the basic cleansing solution includes ethanolamine or ascorbic acid.

8. The method of claim 1, further comprising, after cleansing using the basic cleansing solution, cleansing the first insulation layer and the cobalt-based capping layer using an acidic cleansing solution.

9. The method of claim 8, wherein the acidic cleansing solution is pH 0 to pH 2.

10. The method of claim 8, wherein the acidic cleansing solution includes oxalic acid, sulfuric acid, carboxylic acid, glyoxylic acid, and/or hypophosphorous acid.

11. A method of manufacturing a semiconductor device, the method comprising:
   forming a first insulation layer on a semiconductor substrate;
   forming a groove by selectively etching the first insulation layer;
   forming a preliminary copper-based conductive layer on the first insulation layer so as to fill the groove;
   removing a portion of the preliminary copper-based conductive layer by a chemical mechanical polishing (CMP) method such that the first insulation layer is exposed;
   preliminarily cleansing the exposed first insulation layer and the exposed copper-based conductive layer using another basic cleansing solution;
   depositing a cobalt-based capping layer on the copper-based conductive layer by electroless plating; and
   cleansing the first insulation layer and the cobalt-based capping layer using a basic cleansing solution.

12. The method of claim 11, wherein the basic cleansing solution is pH 10 to pH 14.

13. The method of claim 11, wherein the basic cleansing solution includes ethanolamine or ascorbic acid.

14. The method of claim 11, further comprising, after cleansing using the basic cleansing solution, cleansing the first insulation layer and the cobalt-based capping layer using an acidic cleansing solution.

15. The method of claim 14, further comprising, after cleansing using the acidic cleansing solution, forming a second insulation layer on the exposed first insulation layer and/or the exposed cobalt-based capping layer.

\* \* \* \* \*